US006665736B1

United States Patent
Fan

(10) Patent No.: US 6,665,736 B1
(45) Date of Patent: Dec. 16, 2003

(54) COMPUTER MOTHERBOARD FOR SUPPORTING VARIOUS MEMORIES

(75) Inventor: Chen-Ming Fan, Taipei (TW)

(73) Assignee: Acer Laboratories, Inc., Taipei (TW)

( * ) Notice: Subject to any disclaimer, the term of this patent is extended or adjusted under 35 U.S.C. 154(b) by 464 days.

(21) Appl. No.: 09/624,436

(22) Filed: Jul. 21, 2000

(30) Foreign Application Priority Data

Apr. 13, 2000 (TW) ........................................ 89106924 A

(51) Int. Cl.[7] ................................................ G06F 3/00
(52) U.S. Cl. .............................. 710/2; 710/301; 365/52; 361/18; 361/601; 361/636; 361/679; 361/689
(58) Field of Search ...................... 710/2, 301; 361/683, 361/18, 601, 605, 627, 633, 636, 679, 689, 728–730, 736–738; 365/5, 52

(56) References Cited

U.S. PATENT DOCUMENTS

| 5,805,903 A | * | 9/1998 | Elkhoury | 713/300 |
| 5,884,053 A | * | 3/1999 | Clouser et al. | 710/312 |
| 6,215,686 B1 | * | 4/2001 | Deneroff et al. | 365/52 |
| 6,362,996 B2 | * | 3/2002 | Chang | 365/52 |
| 6,449,679 B2 | * | 9/2002 | Ryan | 710/315 |

* cited by examiner

Primary Examiner—Jeffrey Gaffin
Assistant Examiner—Eron J. Sorrell
(74) Attorney, Agent, or Firm—Swernofsky Law Group PC

(57) ABSTRACT

A computer motherboard selectively uses various memories in the light of a dummy card. The computer motherboard comprises a serial resistor, and a first slot and a second slot for holding various memories, respectively. Various memories can be configured on the motherboard without additional settings by means of predefined dummy card or/and rearranging the location of the serial resistor.

20 Claims, 7 Drawing Sheets

COMPUTER MOTHERBOARD FOR SUPPORTING VARIOUS MEMORIES

REFERENCE TO RELATED APPLICATION

This application claims priority from Taiwanese application Serial No. 089106924, filed on Apr. 13, 2000.

BACKGROUND OF THE INVENTION

1. Field of the Invention

The present invention relates generally to a computer motherboard for supporting various memories, and more particularly to a computer motherboard for supporting single data rate (SDR) dynamic random access memory (DRAM) and double data rate (DDR) DRAM.

2. Description of the Related Art

As the technologies improve day after day, the personal computer-related sciences also drastically improve. For memory storing programs or data in a computer system, the system memory is most often configured onboard. The memory of this sort comprises integrated circuits (ICs), which is also known as main memory.

FIG. 1 is a schematic block diagram of personal computer in the prior art. In FIG. 1, motherboard 100 comprises a central processing unit (CPU) 101, a north bridge (NB) 102 and a DRAM 103. CPU 101 is in charge of computing, processing, controlling and other significant tasks. North bridge 102 is an important device for system demand to high speed processing ability and good performance. DRAM is accessed by CPU, and programs should be placed in the DRAM in order to execute them. DRAM is provided with the advantages of simple structure, high data capacity and low cost so that it is widely used in personal computer system nowadays.

Today memory is made up of several DRAM chips and becomes a memory module called dual inline memory module (hereinafter referred to DIMM). In this specification, both of SDR DIMM and DDR DIMM are constructed of DIMM type memory modules, wherein SDR DIMM is a kind of DIMM made up of several DRAM chips supporting SDR communication, and DDR DIMM is a kind of DIMM made up of several DRAM chips supporting DDR communication, similarly. In view of memory reference clocks, the memories are separated into SDR type and DDR type. FIG. 2 is a timing chart of reference clocks of SDR DIMM and DDR DIMM under the same operating frequency. As shown in FIG. 2, the SDR reference clock is composed of a single clock, but the DDR reference clock is composed of two clocks whose frequencies are identical and whose phases have difference in 180 degrees with each other. For SDR and DDR communication, data transmission occurs while the reference clock reaches the rising edge thereof. In FIG. 2, symbol "↑" represents the time at which data is output. During one clock cycle, SDR memory has one clock rising edge, that is, it has one data output period. During the same cycle, DDR memory has two clock rising edges so it has two data output periods. It is obvious that DDR DIMM operates more efficiently than SDR DIMM. However, SDR DIMM is popular in market these days because of its lower price. Table I shows the transmission bandwidths of SDR DIMM and DDR DIMM.

TABLE I

| TYPE | BANDWIDTH |
| --- | --- |
| SDR66 | 528 MBps |
| SDR100 | 800 MBps |
| SDR133 | 1.1 GBps |
| DDR100 | 1.6 GBps |
| DDR200 | 3.2 GBps |

In Table I, "MBps" represents mega bytes per second, and "GBps" represents giga bytes per second. For instance, SDR66 is a kind of SDR DIMM, operating under 66 MHz frequency, and has 528 MBps transmission bandwidth. As shown in the foregoing Table, under the same operating frequency the transmission bandwidth of DDR memory is better than that of SDR memory.

FIG. 3A is a schematic block diagram showing a conventional motherboard using DDR DIMMs. Motherboard 300 includes a north bridge 301 and two DDR DIMMs lots 302, 303. Certainly, practical circuitry of the motherboard is not that simple as shown in FIG. 3A, so FIG. 3A is merely used to illustrate some circuitries related to memory control or transmission. While a user utilizes DDR DIMMs, DDR DIMM 304, 305 must be inserted into DDR DIMM slots 302, 303.

DDR DIMM is driven by 2.5V power. As shown in FIG. 3A, while applying DDR DIMM on motherboard, there is a serial resistor RS between north bridge 301 and DDR DIMM slot. The resistance of resistor RS is generally 22 ohm. In addition, there is another resistor, termination resistor RT, coupled to DDR DIMM slot. The other terminal of termination resistor RT is coupled to termination voltage VTT. The resistance of termination resistor RT is generally 25 ohm. Termination voltage VTT is ordinarily 1.25V, which is provided from motherboard. To let the logic levels of two individual devices, north bridge and DDR DIMM, respectively reach the predetermined logic ranges, to let the whole circuitry be operated more stably and to diminish the interactive power consumption between these two devices, serial resistor RS, termination resistor RT and termination voltage VTT are applied to the connection of the motherboard.

FIG. 3B is a schematic block diagram showing a conventional motherboard using SDR DIMM. Motherboard 300 includes a north bridge 301 and two SDR DIMM slots 306, 307. Certainly, practical circuitry of the motherboard is not that simple as shown in FIG. 3B, so FIG. 3B is merely used to illustrate some circuitries related to memory control or transmission. When a user utilizes SDR DIMM, SDR DIMM 308, 309 must be inserted into SDR DIMM slots 306, 307.

SDR DIMM is driven by 3.3V power. As shown in FIG. 3B, when applying SDR DIMM on motherboard, there is no serial resistor between north bridge 301 and SDR DIMM slot, and there is no termination resistor coupled to SDR DIMM slot.

Although SDR DIMM is still popular in memory market now, according to conventional experience, new memory product with higher price but having better performance will replace it due to the technical improvement. As for DRAM market, it would be anticipated that DRAM application transits from SDR DIMM to DDR DIMM.

During the transition stage from SDR to DDR, most users request that designed motherboard supports both of SDR DIMM and DDR DIMM in the meantime. Hence, users can utilize SDR DIMM on that motherboard. As DDR DIMM becomes cheaper and users want to change SDR DIMM with DDR DIMM, they can also apply DDR DIMM on the same motherboard without additional expense to replace that motherboard with a new one. Furthermore, the settings on how to use SDR/DDR DIMM are simpler; it is more convenient for users. It would, therefore, not cause users much trouble during the replacement of SDR DIMM and DDR DIMM.

SUMMARY OF THE INVENTION

It is therefore an object of the invention to provide a computer motherboard capable of supporting at least two kinds of memory products and easy setting. Applying the invention in a computer motherboard, users can easily, freely select one type from those memory products to use without complicated settings.

According to an object of the invention, a computer motherboard for selectively using one of SDR DIMM and DDR DIMM by a dummy card is disclosed. The computer motherboard comprises a chip, a SDR DIMM slot, a serial resistor and at least two DDR DIMM slots. The SDR DIMM slot is coupled to the chipset for holding a SDR DIMM. The serial resistor is coupled to the SDR DIMM slot. The DDR DIMM slots are coupled to the resistor for holding one DDR DIMM, respectively. When a DDR DIMM is inserted into one of these DDR DIMM slots, the dummy card should be inserted into another one of the DDR DIMM slots in the meantime.

According to another object of the invention, the invention provides a computer motherboard for selectively using one of SDR DIMM and DDR DIMM by a dummy card. The computer motherboard comprises a chipset, a serial resistor, a SDR DIMM slot and at least two DDR DIMM slots. The serial resistor is coupled to the chipset when the SDR DIMM slot for holding a SDR DIMM is coupled to the serial resistor. The DDR DIMM slots for respectively holding one DDR DIMM are coupled to the SDR DIMM slot. The dummy card is inserted into one of the DDR DIMM slots while a DDR DIMM is inserted into another one of the DDR DIMM slots.

According to one object of the invention, the invention provides a computer motherboard for selectively using one type of SDR DIMM and DDR DIMM by a dummy card. The computer motherboard comprises a chipset, a serial resistor, at least two DDR DIMM slots and a SDR DIMM slot. The serial resistor is coupled to the chipset. The DDR DIMM slots for respectively holding a DDR DIMM is coupled to the serial resistor. The SDR DIMM slot for holding a SDR DIMM is coupled to the DDR DIMM slots. When a DDR DIMM is inserted into one of the DDR DIMM slots, the dummy card is inserted into another one of the DDR DIMM slots.

According to further object of the invention, the invention provides a computer motherboard for selectively using one of SDR DIMM and DDR DIMM by a dummy card. The computer motherboard comprises a chipset, a serial resistor, a SDR DIMM slot and a DDR DIMM slot. The serial resistor is coupled to the chipset. The SDR DIMM slot for holding a SDR DIMM is coupled to the serial resistor. The DDR DIMM slot for holding a DDR DIMM is coupled to the SDR DIMM slot. When a DDR DIMM is inserted into the DDR DIMM slot, the dummy card is inserted into the SDR DIMM slot.

According to one object of the invention, a computer motherboard is provided for selectively using one of SDR DIMM and DDR DIMM by a dummy card. The computer motherboard comprises a chipset, a serial resistor, a DDR DIMM slot and a SDR DIMM slot. The serial resistor is coupled to the chipset. The DDR DIMM slot for holding a DDR DIMM is coupled to the serial resistor. The SDR DIMM slot for holding a SDR DIMM is coupled to the DDR DIMM slot. When a DDR DIMM is inserted into the DDR DIMM slot, the dummy card is inserted into the SDR DIMM slot.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

The invention utilizing a dummy card and a serial resistor enables the computer motherboard of the invention to support SDR DIMM and DDR DIMM. Of course, the motherboard has two types of memory slots: SDR DIMM slot and DDR DIMM slot.

In some preferred embodiments of the invention, the dummy card is designed for being inserted into a SDR DIMM slot. However, in other preferred embodiments, the dummy is designed for being inserted into a DDR DIMM slot. These variations can be achieved by altering the connected configuration of the serial resistor and the pin configuration of the predefined dummy card.

As given in the specification of SDR/DDR DIMM, a SDR DIMM has 168 pins, wherein there are 18 NC pins that are designated to user assignment. However a DDR DIMM has 184 pins, wherein there are 8 NC pins that are designated to user assignment. Therefore, in the preferred embodiments of the invention, two types of dummy cards having different pins with each other are provided. One of the dummy cards has 168 pins for inserting a SDR DIMM slot, but the other has 184 pins for inserting a DDR DIMM slot.

Figure 1:
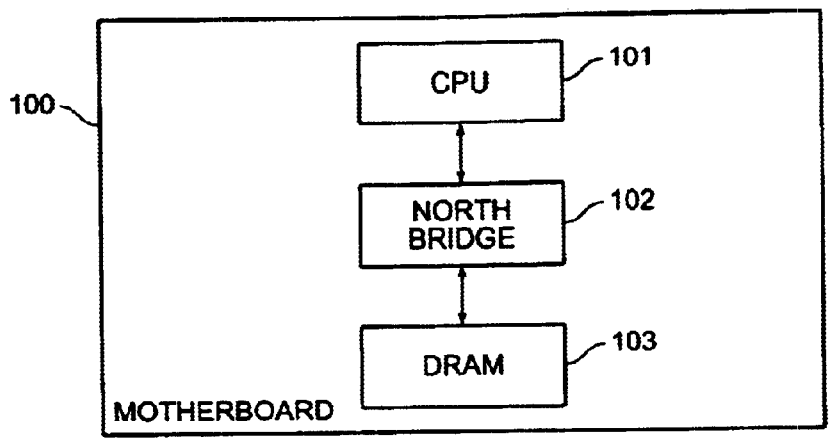
FIG. 1 is a block diagram showing main element ports of a personal computer.
Figure 2:
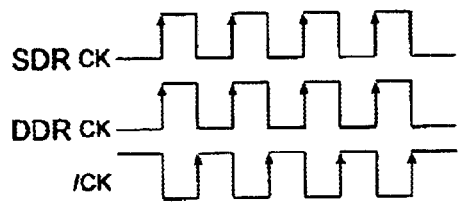
FIG. 2 is a timing chart of reference clocks of SDR DIMM and DDR DIMM under the same operating frequency.
Figure 3A:
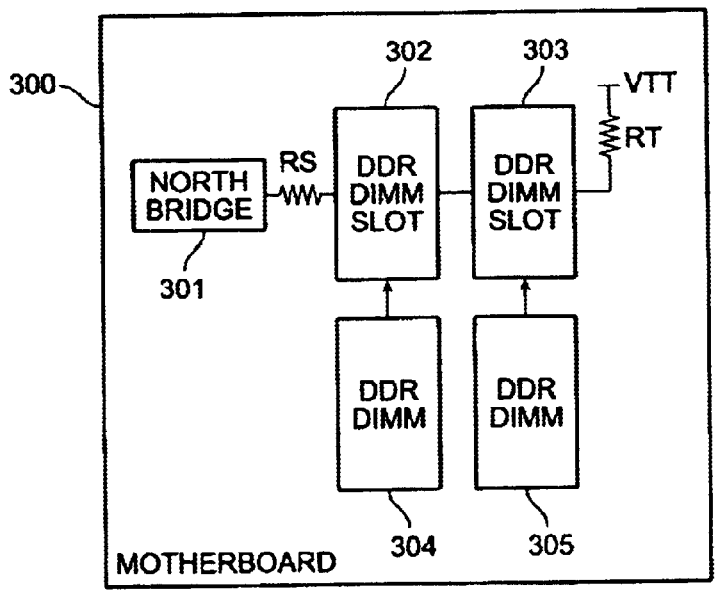
FIG. 3A is a schematic block diagram showing a conventional motherboard using DDR DIMM.
Figure 3B:
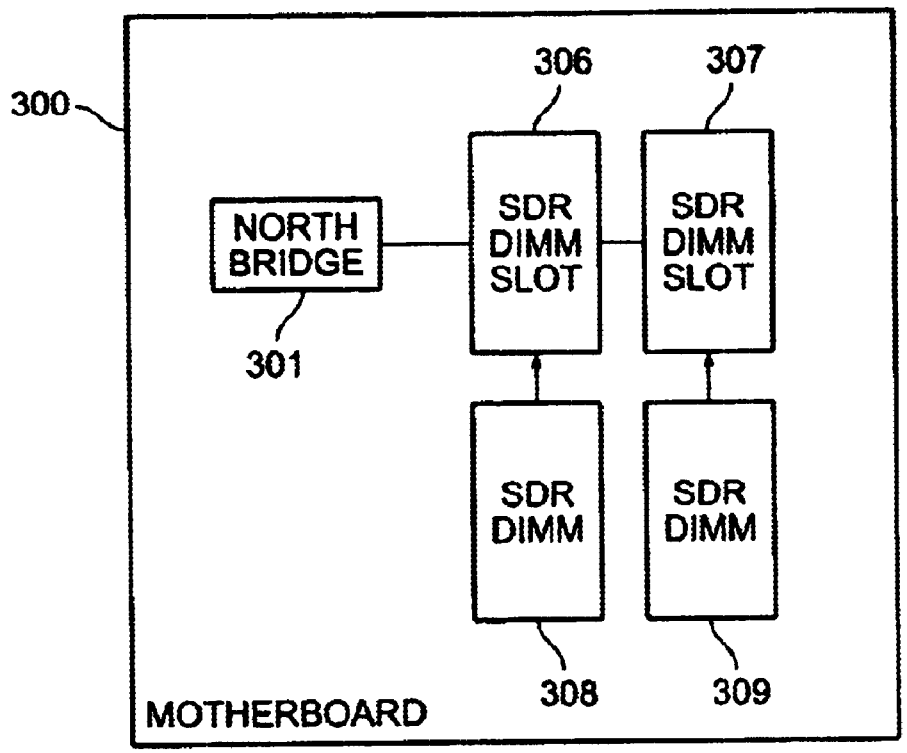
FIG. 3B is a schematic block diagram showing a conventional motherboard using SDR DIMM.
Figure 4A:
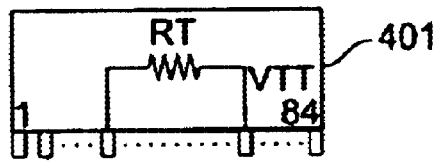
FIGS. 4A and 4B are schematic block diagrams showing respectively two examples of dummy cards according to the invention.
Figure 4B:
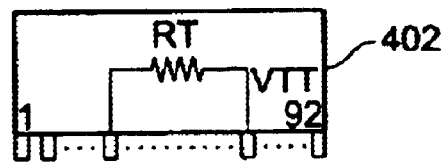

FIGS. 4A and 4B respectively show two types of the dummy cards in accordance with the preferred embodiments of the invention. A dummy card 401 shown in FIG. 4A is to be inserted into a SDR DIMM slot, however a dummy card 402 shown in FIG. 4B is to be inserted into a DDR DIMM slot.

Referring to FIG. 4A, the dummy card 401 of the invention has 168 pins numbered from 1 to 168. The 168 pins of the dummy card 401 are configured on two sides of the DIMM, which are divided into two groups: one has pins 1–84 located on one side of the DIMM, and the other one has pins 85–168 located on the other side of the DIMM. Pin 85 is opposite to pin 1 so the two pins are placed on two sides of the DIMM; pin 86 is opposite to pin 2 and the rest may be deduced by analogy.

Some specific pins of the dummy card 401, such as signal lines (DQ, DQM and DQS) corresponding to the data bus of DDR DIMM, are respectively coupled to a corresponding termination resistor RT. Like conventional connecting scheme, one end of each of the termination resistors RT is coupled to a termination voltage VTT. In the invention, the resistance of the termination resistor RT is 25 ohm. Certainly, its resistance can be chosen properly by any need without the limitation to 25 ohm. For instance the termination voltage VTT is about 1.25 volt. The pin configuration of the dummy card 402 shown in FIG. 4B is similar to that of the dummy card 401 shown in FIG. 4A, so it will not be described in details hereinafter.

With respect to the desired power of the dummy cards 401 and 402, the power of the motherboard is provided to the dummy card inner through some pins of the dummy card 401 or 402, and it is provided as the termination voltage VTT, in which these pins of the dummy card correspond to the NC pins of the DDR DIMM slot. Alternatively, 2.5-volt power terminal of the DDR DIMM slot, i.e. VDD terminal, can be used as a power source of the dummy card through a pin of the dummy card, wherein the voltage VDD can be converted to the termination voltage VTT (1.25 volt) by the dummy card. In the circumstance, in order to provide stable voltage for fulfilling the tolerance requirement of the logic level according to the DDR DIMM specification, the dummy card is desired to provide a built-in step-down circuit or voltage regulator (not shown). Utilizing the voltage regulator, one scheme is setting the voltage regulator between the termination resistor RT and the VDD power supply terminal of the dummy card.

Thereinafter, the invention is disclosed according to some preferred embodiments of the invention.

Figure 5A:
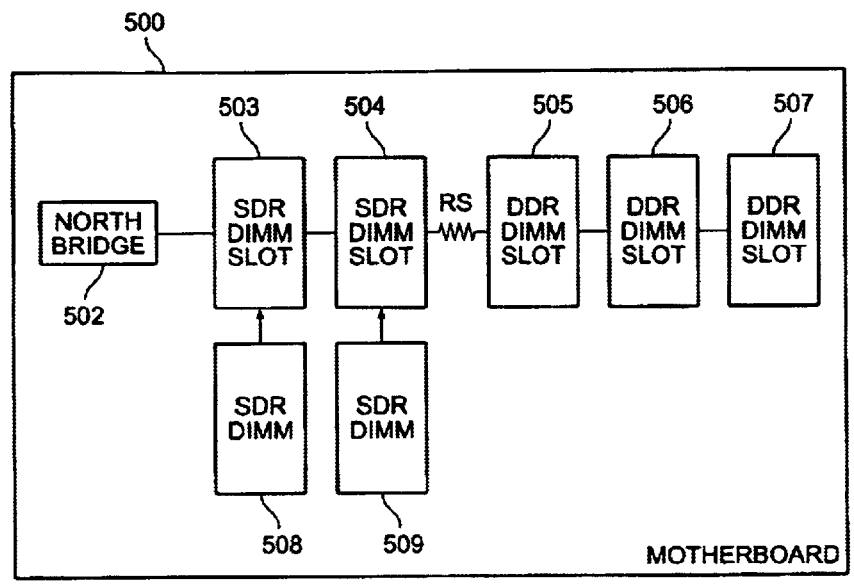
FIGS. 5A and 5B show the configuration of the motherboard according to the first embodiment of the invention.
Figure 5B:
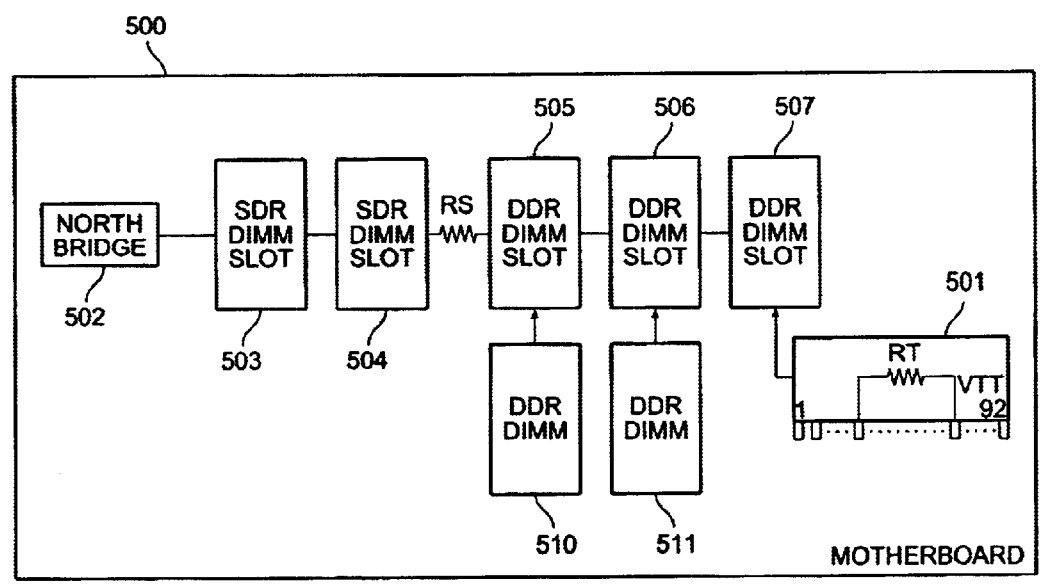

The first preferred embodiment:

FIGS. 5A and 5B show the connecting configuration of the motherboard's main elements according to the first preferred embodiment of the invention. FIG. 5A shows one situation that applies SDR DIMMs on a motherboard while FIG. 5B shows another situation that applies DDR DIMMs on the motherboard.

As shown in FIG. 5A, the motherboard 500 comprises a north bridge 502, two SDR DIMM slots 503–504, a serial resistor RS and three DDR DIMM slots 505–507. The SDR DIMMs lots are provided for respectively holding SDR DIMMs. In the preferred embodiment, the serial resistor RS is located between the SDR DIMM slots and the DDR DIMM slots. The resistance of the serial resistor RS is chosen as 22 ohm. Of course, its resistance can be chosen properly by any need without the limitation to 22 ohm.

Referring to FIG. 5A, while users desire to utilize SDR DIMM on the motherboard 500, they merely need to insert SDR DIMMs 508, 509 into the SDR DIMM slots 503, 504 without further configuring the settings of the motherboard 500. In this condition users have no need to apply the dummy card on the motherboard.

Further please refer to FIG. 5B, which shows a diagram of the embodiment supporting DDR DIMMs. In the circumstance of utilizing DDR DIMMs, users not only insert the DDR DIMMs 510 and/or 511 into the DDR DIMM slots 505–506, but also insert the dummy card 501 into the DDR DIMM slot 507. The dummy card 501 is identical to the dummy card 402 shown in FIG. 4B. Certainly, instead of being inserted into the DDR DIMM slot 507, the dummy card 501 can be inserted into another DDR DIMM slot of the motherboard. In this embodiment, when users desire to use DDR DIMMs, the dummy card set should be inserted into a DDR DIMM slot on the motherboard.

With respect to the desired power of the dummy card 501, the power source on the motherboard can be provided to the dummy card inner through one/some of the NC pins of the dummy card 501, and it is provided as the termination voltage VTT (1.25 volt), in which the power pin of the dummy card corresponds to the adopted NC pin of the DDR DIMM slot. Alternatively, the VDD voltage power (2.5 volt) of the DDR DIMM slot can be introduced to the dummy card as a power source of the dummy card through a pin of the dummy card, wherein the voltage VDD can be converted to the termination voltage VTT (1.25 volt) by the dummy card 501. In the circumstance, in order to provide a stable voltage for fulfilling the tolerance requirement of the logic level according to the DDR DIMM specification, the dummy card 501 is desired to provide a built-in step-down circuit or voltage regulator (not shown). Utilizing the voltage regulator, one scheme is setting the voltage regulator between the termination resistor RT and the VDD power supply terminal of the dummy card 501.

Figure 6A:
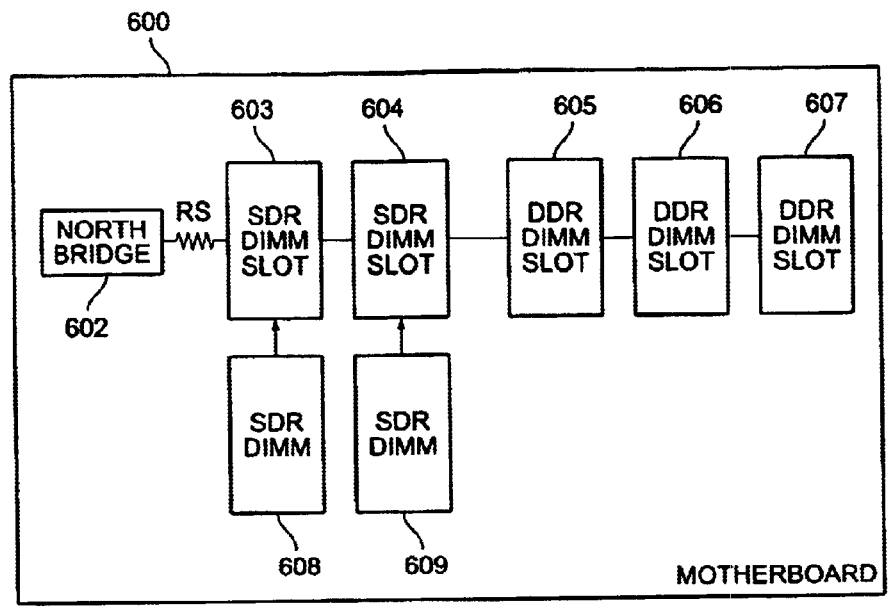
FIGS. 6A and 6B show the configuration of the motherboard according to the second embodiment of the invention.
Figure 6B:
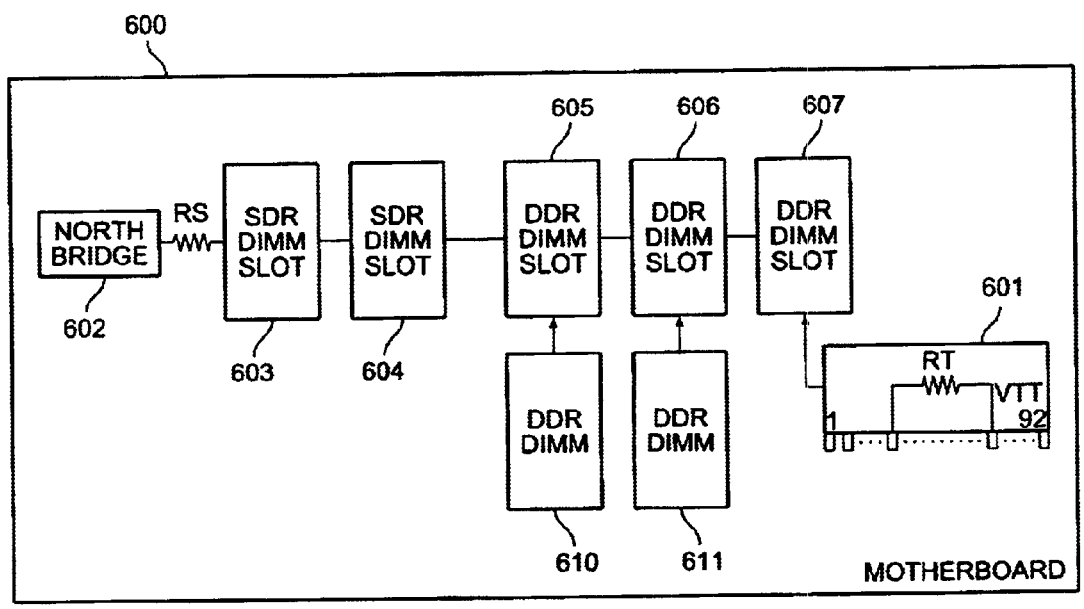

The second preferred embodiment:

FIGS. 6A and 6B show the connecting configuration of the motherboard's main elements according to the second preferred embodiment of the invention. FIG. 6A shows one situation that applies SDR DIMMs on a motherboard while FIG. 6B shows another situation that applies DDR DIMMs on the motherboard.

As shown in FIG. 6A, the motherboard 600 comprises a north bridge 602, a serial resistor RS, two SDR DIMM slots 603–604 and three DDR DIMM slots 605–607. In the preferred embodiment, the serial resistor RS is located between the north bridge 602 and the SDR DIMM slot 603.

FIG. 6A is similar to FIG. 5A so it will not be interpreted repeatedly again. Similarly, FIG. 6B resembles FIG. 5B. Namely, the termination voltage VTT can be introduced via the NC pin or it can be converted from the VDD voltage power. If the termination voltage VTT is gained by voltage conversion, it is desired that the dummy card 601 has a built-in step-down circuit or voltage regulator (not shown).

Figure 7A:
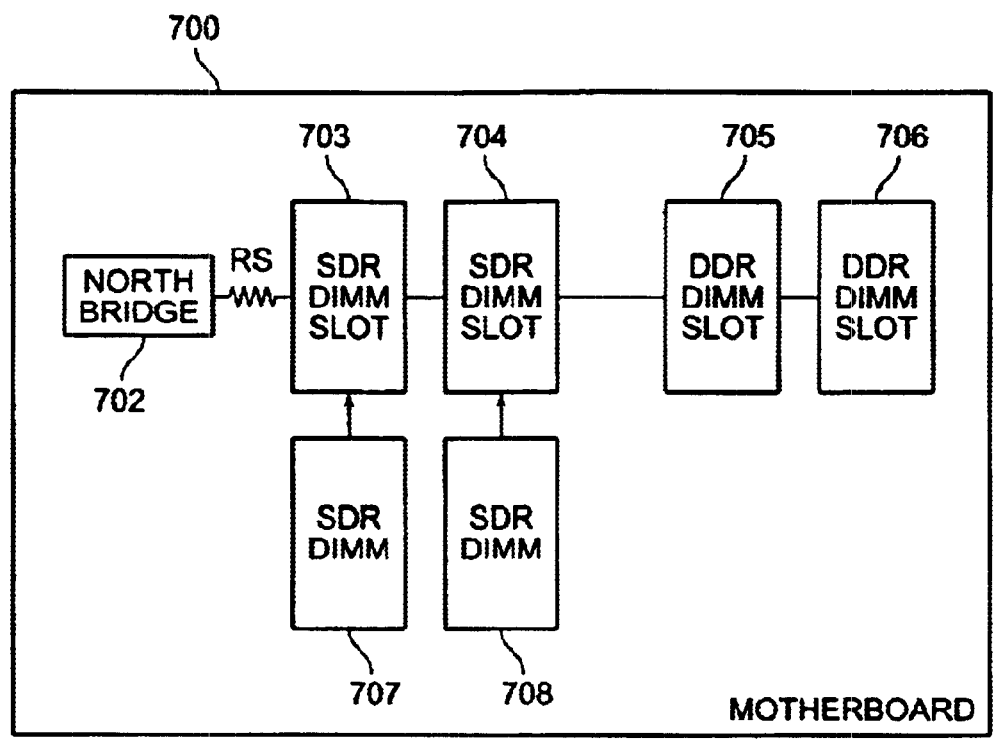
FIGS. 7A and 7B show the configuration of the motherboard according to the third embodiment of the invention.
Figure 7B:
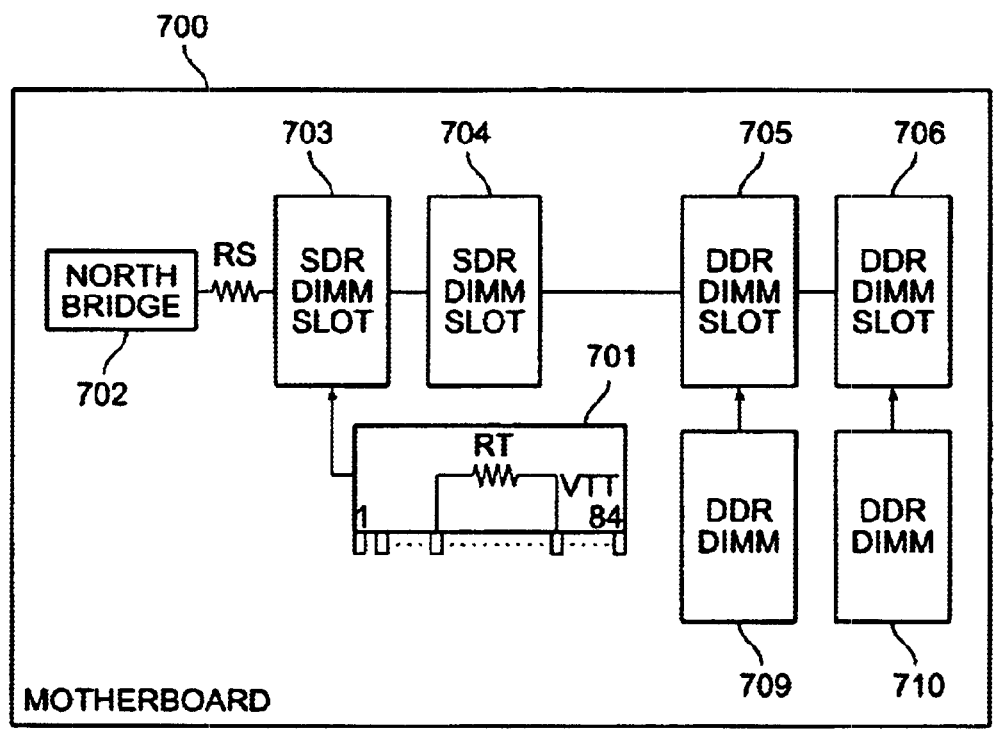

The third preferred embodiment:

FIGS. 7A and 7B show the connecting configuration of the motherboard main elements according to the third preferred embodiment of the invention. FIG. 7A shows one situation that applies SDR DIMMs on a motherboard while FIG. 7B shows another situation that applies DDR DIMMs on the motherboard.

As shown in FIG. 7A, the motherboard 700 comprises a north bridge 702, a serial resistor RS, two SDR DIMM slots 703–704 and two DDR DIMM slots 705–706. In the preferred embodiment, the serial resistor RS is located between the north bridge 702 and the SDR DIMM slot 703.

FIG. 7A is similar to FIG. 5A so it will not be interpreted repeatedly again. Referring to FIG. 7B, in this preferred embodiment, while applying DDR DIMMs on the motherboard, besides inserting DDR DIMMs 709 and/or 710 into DDR DIMM slots 705, 706, it is desired that inserting the dummy card 701 into the SDR DIMM slot 703 or 704. Owing to the dummy card 701 is inserted into the SDR DIMM slot, the circuit configuration of the dummy card 701 is the same as the dummy card 401 shown in FIG. 4A.

As for the DDR DIMM specification, the data bus of DDR DIMM comprises not only DQ and DQM signal lines but also DQS. Therefore, DDR DIMM has additional 8 DQS pins than SDR DIMM. In this embodiment, the 18 NC pins of SDR DIMM should be properly designated, so as to insert the dummy card 701 into the SDR DIMM slot, wherein the 8 NC pins of SDR DIMM correspond to the 8 DQS pins of DDR DIMM. In addition, the 10 NC pins of SDR DIMM can be used to introduce the power source on the motherboard into the inner of the dummy card 701 so that the power source on the motherboard can be converted into the termination voltage VTT (1.25 volt), wherein the dummy card 701 is provided with a step-down circuit or voltage regulator (not shown).

Figure 8A:
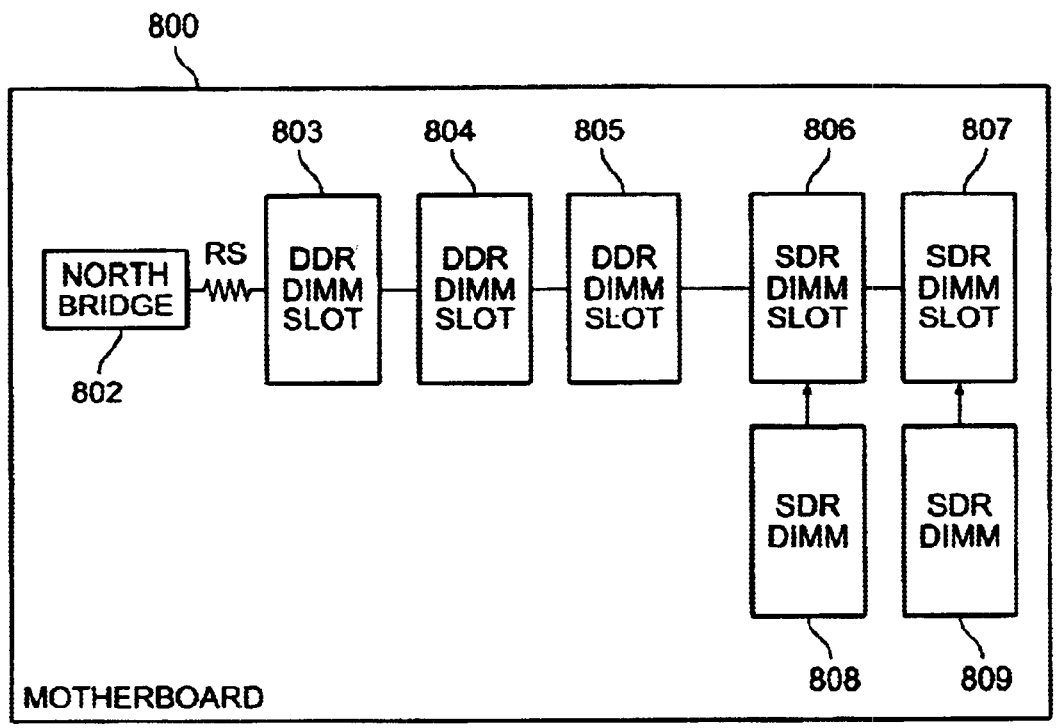
FIGS. 8A and 8B show the configuration of the motherboard according to the fourth embodiment of the invention.
Figure 8B:
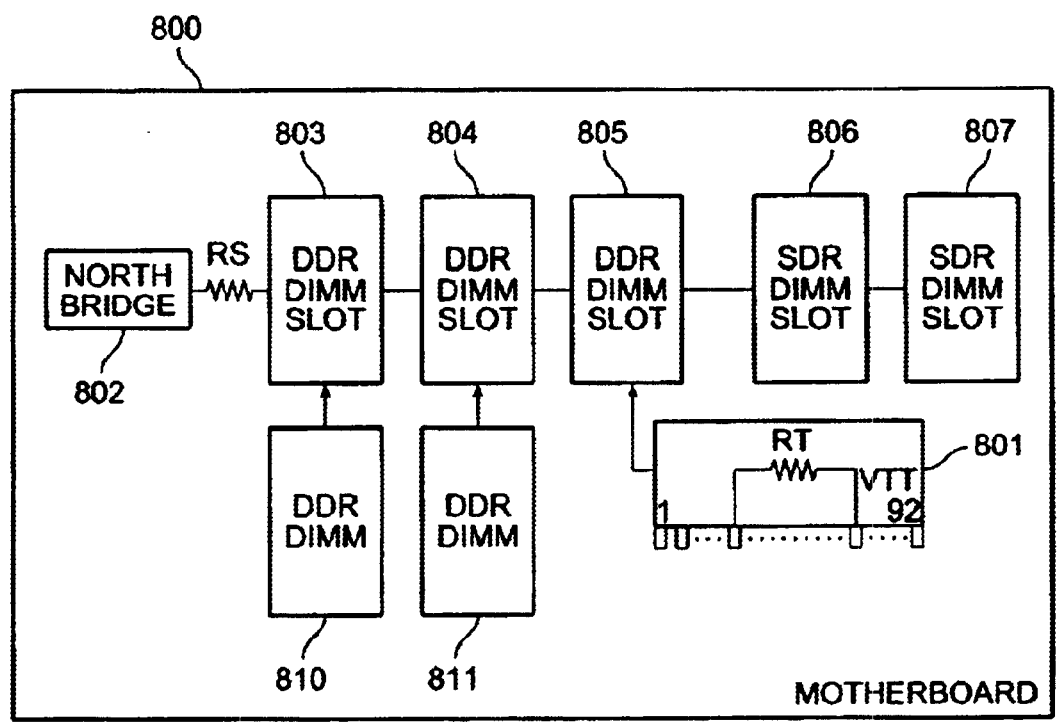

The fourth preferred embodiment:

FIGS. 8A and 8B show the connecting configuration of the motherboard main elements according to the fourth preferred embodiment of the invention. FIG. 8A shows one situation that applies SDR DIMMs on a motherboard while FIG. 8B shows another situation that applies DDR DIMMs on the motherboard.

As shown in FIG. 8A, the motherboard 800 comprises a north bridge 802, a serial resistor RS, three DDR DIMM slots 803–805 and two SDR DIMM slots 806–807. In the preferred embodiment, the serial resistor RS is located between the north bridge 802 and the DDR DIMM slot 803.

Referring to FIG. 8A, under the manner of using SDR DIMMs, users only need to insert the SDR DIMMs 808, 809 into the SDR DIMM slots 806, 807 without any additional settings.

Further referring to FIG. 8B, in this embodiment, while applying DDR DIMMs on the motherboard, not only the DDR DIMMs 810 and/or 811 are inserted into the DDR DIMM slots 803–805, but also should the dummy card 801 be inserted into one of the SDR DIMM slots 805–807. The dummy card 801 is inserted into any one of the SDR DIMM slots so its pin configuration is the same as the dummy card 402 shown in FIG. 4B. As for power introduction from the motherboard, FIG. 8B is similar with FIG. 5B so it will not be illustrated again.

Figure 9A:
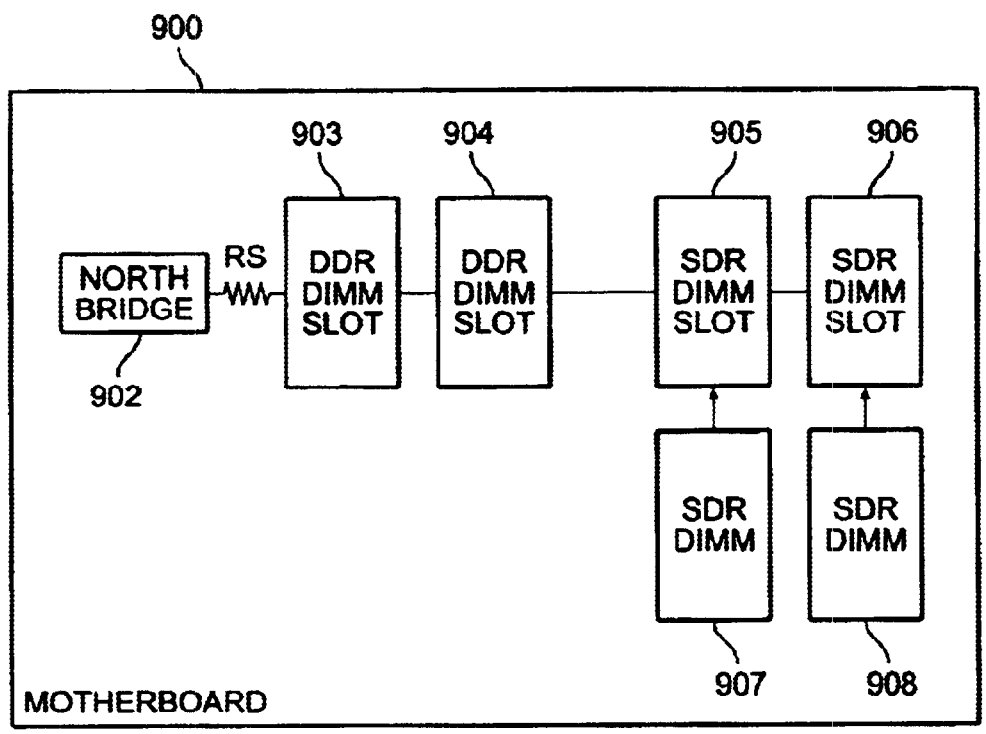
FIGS. 9A and 9B show the configuration of the motherboard according to the fifth embodiment of the invention.
Figure 9B:
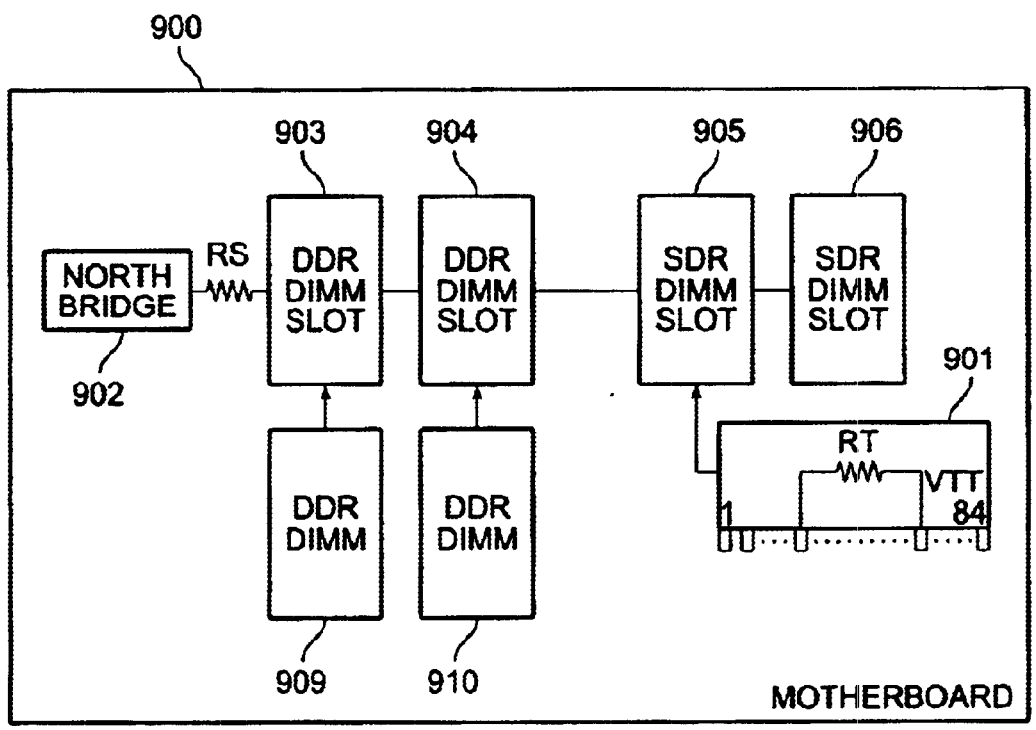

The fifth preferred embodiment:

FIGS. 9A and 9B show the connecting configuration of the motherboard main elements according to the fifth preferred embodiment of the invention. FIG. 9A shows one situation that applies SDR DIMMs on a motherboard while FIG. 9B shows another situation that applies DDR DIMMs on the motherboard.

As shown in FIG. 9A, the motherboard 900 comprises a north bridge 902, a serial resistor RS, two DDR DIMM slots 903–904 and two SDR DIMM slots 905–906. In the preferred embodiment, the serial resistor RS is located between the north bridge 902 and the DDR DIMM slot 903.

Referring to FIG. 9A, under the manner of using SDR DIMMs, users only need to insert the SDR DIMMs 907, 908 into the SDR DIMM slots 905, 906 without any additional settings.

Further referring to FIG. 9B, in this embodiment, while applying DDR DIMMs on the motherboard, not only the DDR DIMMs 909 and/or 910 are inserted into the DDR DIMM slots 903–904, but also should the dummy card 901 be inserted into one of the SDR DIMM slots 905–906. The dummy card 901 is inserted into any one of the SDR DIMM slots so its pin. configuration is the same as the dummy card 401 shown in FIG. 4A. The configuration of the 18 pins of the SDR DIMM slot in this embodiment can be the same as that shown in FIG. 7B. As for power introduction of the dummy card 901, FIG. 9B is similar to FIG. 7B so it will not be illustrated again.

In addition, in the invention, SDR DIMMs and DDR DIMMs cannot be simultaneously applied on the motherboard in order to prevent the access confliction of system memory.

As described above, the preferred embodiments of the invention disclose lots of motherboards that can utilizing one of two different types of DRAM DIMMs, e.g. SDR and DDR DIMMs. By means of placing the serial resistor on a suitable position and utilizing the NC pins of the DIMM slot, users can freely select one of the various types of memory cards by applying a specific dummy card on a motherboard, which is disclosed by the invention.

While the invention has been described with reference to various illustrative embodiments, the description is not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within.the scope of the invention defined by the following claims and their equivalents.

What is claimed is:

1. A computer motherboard for selectively using single data rate (SDR) dual inline memory module (DIMM) and double data rate (DDR) DIMM by a dummy card, said computer motherboard comprising:

a chipset;

a SDR DIMM slot, coupled to said chipset, for holding a SDR DIMM;

a serial resistor, coupled to said SDR DIMM slot; and at least two DDR DIMM slots, coupled to said serial resistor, each for holding a DDR DIMM;

wherein when the DDR DIMM is inserted into one of said DDR DIMM slots, the dummy card is inserted into another one of said DDR DIMM slots; and wherein said serial resistor is serially coupled between said SDR DIMM slot and said DDR DIMM slots.

2. A computer motherboard according to claim 1, wherein the dummy card comprises at least one termination resistor, one end of said termination resistor coupled to a power supply pin of said dummy card, said power supply pin corresponding to a power supply terminal of said DDR DIMM slot, the other end of said termination resistor coupled to a pin, corresponding to a signal pin of the DDR DIMM, of said dummy card.

3. A computer motherboard according to claim 2, wherein the dummy card further comprises at least one voltage regulator coupled between said termination resistor and said power supply pin.

4. A computer motherboard for selectively using single data rate (SDR) dual inline memory module (DIMM) and double data rate (DDR) DIMM by a dummy card, said computer motherboard comprising:

a chipset;

a serial resistor, coupled to said chipset;

a SDR DIMM slot, coupled to said serial resistor, for holding a SDR DIMM; and at least two DDR DIMM slots, coupled to said SDR DIMM slot, each for holding a DDR DIMM;

wherein when the DDR DIMM is inserted into one of said DDR DIMM slots, the dummy card is inserted into another one of said DDR DIMM slots and wherein said serial resistor is serially coupled between said chipset and said SDR DIMM slot.

5. A computer motherboard according to claim 4, wherein the dummy card comprises at least one termination resistor, one end of said termination resistor coupled to a power supply pin of said dummy card, said power supply pin corresponding to a power supply terminal of said DDR DIMM slot, the other end of said termination resistor coupled to a pin, corresponding to a signal pin of the DDR DIMM, of said dummy card.

6. A computer motherboard according to claim 5, wherein the dummy card further comprises at least one voltage regulator coupled between said termination resistor and said power supply pin.

7. A computer motherboard for selectively using single data rate (SDR) dual inline memory module (DIMM) and double data rate (DDR) DIMM by a dummy card, said computer motherboard comprising:

a chipset;

a serial resistor, coupled to said chipset;

at least two DDR DIMM slots, coupled to said serial resistor, each for holding a DDR DIMM; and a SDR DIMM slot, coupled to said DDR DIMM slots, for holding a SDR DIMM;

wherein when the DDR DIMM is inserted into one of said DDR DIMM slots, the dummy card is inserted into another one of said DDR DIMM slots; and wherein said serial resistor is serially coupled between said chipset and said DDR DIMM slots.

8. A computer motherboard according to claim 7, wherein the dummy card comprises at least one termination resistor, one end of said termination resistor coupled to a power supply pin of said dummy card, said power supply pin corresponding to a power supply terminal of said DDR DIMM slot, the other end of said termination resistor coupled to a pin, corresponding to a signal pin of the DDR DIMM, of said dummy card.

9. A computer motherboard according to claim 8, wherein the dummy card further comprises at least one voltage regulator coupled between said termination resistor and said power supply pin.

10. A computer motherboard for selectively using single data rate (SDR) dual inline memory module (DIMM) and double data rate (DDR) DIMM by a dummy card, said computer motherboard comprising:

a chipset;

a serial resistor, coupled to said chipset;

a SDR DIMM slot, coupled to said serial resistor, for holding a SDR DIMM; and a DDR DIMM slot, coupled to said SDR DIMM slot, for holding a DDR DIMM;

wherein when the DDR DIMM is inserted into said DDR DIMM slot, the dummy card is inserted into said SDR DIMM slot; and wherein said serial resistor is serially coupled between said chipset and said SDR DIMM slot.

11. A computer motherboard according to claim 10, wherein the dummy card comprises at least one termination resistor, one end of said termination resistor coupled to a power supply pins of said dummy card, said power supply pin corresponding to a contact terminal of said SDR DIMM slot, the contact terminal used to transmit power, the other end of said termination resistor coupled to a pin, corresponding to a signal pin of the DDR DIMM, of said dummy card.

12. A computer motherboard according to claim 11, wherein the dummy card further comprises at least one voltage regulator coupled between said termination resistor and said power supply pin.

13. A computer motherboard for selectively using single data rate (SDR) dual inline memory module (DIMM) and double data rate (DDR) DIMM by a dummy card, said computer motherboard comprising:

a chipset;

a serial resistor, coupled to said chipset;

a DDR DIMM slot, coupled to said serial resistor, for holding a DDR DIMM; and a SDR DIMM slot, coupled to said DDR DIMM slot, for holding a SDR DIMM;

wherein when the DDR DIMM is inserted into said DDR DIMM slot, the dummy card is inserted into said SDR DIMM slot; and wherein said serial resistor is serially coupled between said chipset and said DDR DIMM slot.

14. A computer motherboard according to claim 13, wherein the dummy card comprises at least one termination resistor, one end of said termination resistor coupled to a power supply pins of said dummy card, said power supply pin corresponding to a contact terminal of said SDR DIMM slot, the contact terminal used to transmit power, the other end of said termination resistor coupled to a pin, corresponding to a signal pin of the DDR DIMM, of said dummy card.

15. A computer motherboard according to claim 14, wherein the dummy card further comprises at least one voltage regulator coupled between said termination resistor and said power supply pin.

16. A computer motherboard for supporting single data rate (SDR) dual inline memory module (DIMM) and double data rate (DDR) DIMM, said computer motherboard comprising:

a chipset;

a SDR DIMM slot, coupled to said chipset, for holding a SDR DIMM;

a serial resistor, one end thereof coupled to said SDR DIMM slot; and at least two DDR DIMM slots, each of which coupled to the other end of said serial resistor, for respectively holding a DDR DIMM.

17. A computer motherboard according to claim 16, further comprising a dummy card optionally inserted into one of said DDR DIMM slots if a DDR DIMM is inserted into other one of said DDR DIMM slots.

18. A computer motherboard for supporting single data rate (SDR) dual inline memory module (DIMM) and double data rate (DDR) DIMM, said computer motherboard comprising:

a chipset;

a serial resistor, one end thereof coupled to said chipset;

a SDR DIMM slot, coupled to the other end of said serial resistor, for holding a SDR DIMM;

a DDR DIMM slot, coupled to said SDR DIMM slot, for optionally holding a DDR DIMM or a dummy card.

19. A computer motherboard according to claim 18, further comprising said dummy card optionally inserted into said SDR DIMM slot if a DDR DIMM is inserted into said DDR DIMM slot.

20. A computer motherboard according to claim 19, further comprising a second DDR DIMM slot which is coupled to said SDR DIMM slot for optionally holding a DDR DIMM or a dummy card, wherein the dummy card is optionally inserted into said second DDR DIMM slot if a DDR DIMM is inserted into said DDR DIMM slot.

* * * * *